(12) United States Patent
Groves et al.

(10) Patent No.: US 6,549,096 B2
(45) Date of Patent: Apr. 15, 2003

(54) SWITCHED INDUCTOR/VARACTOR TUNING CIRCUIT HAVING A VARIABLE INTEGRATED INDUCTOR

(75) Inventors: Robert A. Groves, Highland, NY (US); Dale K. Jadus, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,944

(22) Filed: Mar. 19, 2001

(65) Prior Publication Data

US 2002/0158711 A1 Oct. 31, 2002

(51) Int. Cl.7 .............................. H03H 7/01; H03J 3/20
(52) U.S. Cl. .......................................... 333/174; 334/56
(58) Field of Search .................................. 333/174, 179; 334/56, 59, 60, 75; 336/232, 222

(56) References Cited

U.S. PATENT DOCUMENTS

| | | | |
|---|---|---|---|
| 2,100,402 A | * 11/1937 | Lyons ........................... 333/175 |
| 3,984,787 A | 10/1976 | Rosen et al. .................. 331/107 |
| 5,021,758 A | 6/1991 | Lane ............................ 333/245 |
| 5,166,646 A | 11/1992 | Avanic et al. ................ 331/107 |
| 5,497,028 A | 3/1996 | Ikeda et al. .................. 257/531 |
| 5,721,517 A | 2/1998 | Goma et al. .................. 333/117 |
| 5,760,456 A | 6/1998 | Grzegorek et al. .......... 333/172 |
| 5,831,331 A | 11/1998 | Lee .............................. 257/659 |
| 5,872,384 A | 2/1999 | Gabara ......................... 257/421 |
| 5,872,489 A | 2/1999 | Chang et al. ................. 333/179 |
| 5,912,596 A | 6/1999 | Ghoshal ..................... 331/117 R |
| 5,936,299 A | 8/1999 | Burghartz et al. ........... 257/531 |
| 5,952,893 A | 9/1999 | Ghoshal ....................... 331/108 |
| 6,014,064 A | 1/2000 | Boles et al. .................. 331/108 |
| 6,037,649 A | 3/2000 | Liou ............................. 336/65 |
| 6,233,834 B1 | * 5/2001 | Walsh ........................... 336/174 |
| 6,316,819 B1 | * 11/2001 | Zivic ............................ 257/595 |

* cited by examiner

*Primary Examiner*—Seungsook Ham
(74) *Attorney, Agent, or Firm*—Joseph P. Abate; Ratner & Prestia

(57) ABSTRACT

The magnetic field of an inductor is decreased by the presence of one or more single loop windings positioned in proximity to the inductor. The single loop windings have open circuits that are selectively closed to magnetically couple the single loop windings to the inductor. A switched inductor/varactor tuning circuit is formed by connecting a varactor to the inductor.

12 Claims, 4 Drawing Sheets

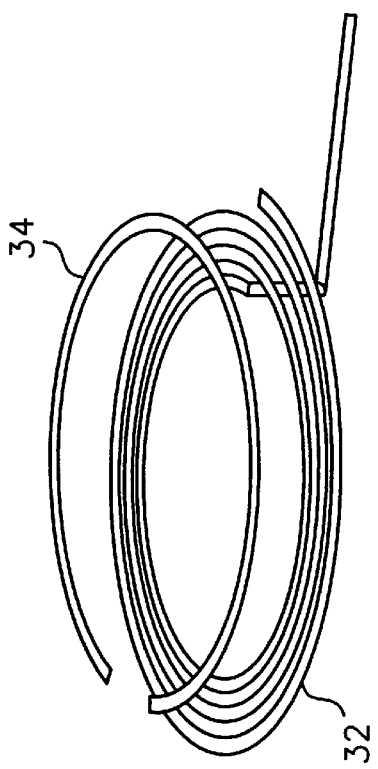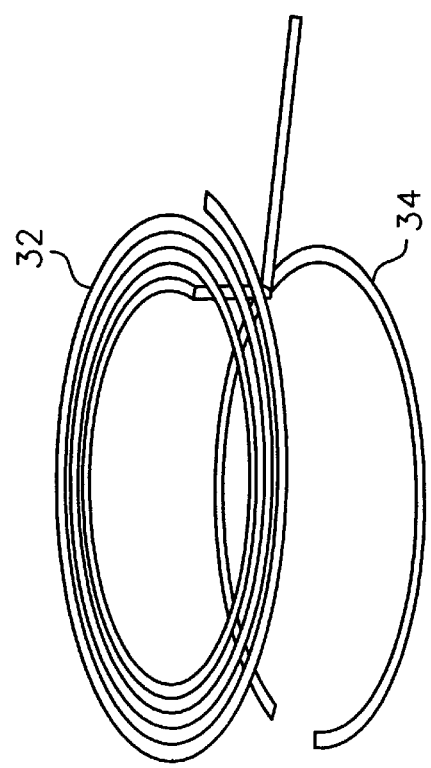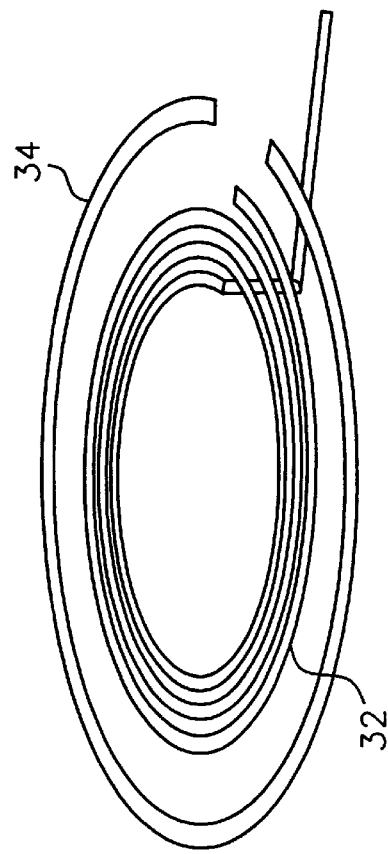
FIG. 3A
FIG. 3B
FIG. 3C

SWITCHED INDUCTOR/VARACTOR TUNING CIRCUIT HAVING A VARIABLE INTEGRATED INDUCTOR

TECHNICAL FIELD

The present invention relates, in general, to electronic components and circuits for selecting signals having specific frequencies and signals within frequency bands and, in particular, to a variable inductor and associated circuitry for frequency and frequency band selection.

BACKGROUND OF THE INVENTION

Many mixed signal and radio frequency applications require variable reactive elements (e.g., inductors or capacitors) to achieve tuning, band switching, phase locked loop functions, etc. Such reactive elements are used in some type of circuit where the reactive element is resonated with another reactive element. The desired result is a resonant circuit that has a response that can be tuned from one frequency to another dynamically.

Typically, this is accomplished using a varactor to provide a variable capacitance that is resonated with a fixed inductor. One problem with using a varactor that is integrated in a typical silicon process is that the tuning range is limited, particularly for "free" varactors that use the standard BiCMOS diodes or FETs as the variable capacitance element. The tuning range typically is less than 2:1.

Varactors implemented with special processing steps to optimize the tuning range and/or the quality factor Q will cause the overall processing cost and turn around time to increase. When a large change in frequency is desired for a varactor that does not have the desired tuning range, a bank of capacitors might be used that can be switched in and out of the circuit selectively to provide a range of discrete capacitance values. A varactor is placed in parallel with this "discrete variable" capacitor to provide a smooth variation of capacitance around the larger steps provided by the switched bank. This is shown in FIG. 1.

Referring to FIG. 1, a varactor 10 is connected in parallel with a resonating inductor 12. A bank of capacitors 14 and series connected switches 16 is connected in parallel with varactor 10 and resonating inductor 12. Operation of switches 16 is controlled by a controller 18 from which control signals are supplied to selectively open and close the switches and thereby change the tuning of the circuit as capacitors 14 are switched into or out of the circuit. Controller 18 receives input signals along input lines 20 that define which of the capacitors 14 are to be switched into the circuit or switched out of the circuit.

A major disadvantage of a circuit, such as the one illustrated in FIG. 1, is that the effective "smooth" tuning range of the combined discrete capacitor/varactor structure is inversely proportional to the amount of fixed capacitance in parallel with the varactor. Therefore, if a large discrete capacitor is placed in parallel with a comparatively small varactor, the overall smooth tuning range of the combined structure will be significantly reduced. This means that more bits of resolution are required from the "discretely variable" capacitor bank to compensate for the lost smooth variation provided by the varactor that is placed in parallel. This increased resolution takes up valuable chip area resulting in increased cost.

Another disadvantage is that the capacitance of the discrete capacitor bank might have a strong dependence on process variation, causing a large statistical variation in the capacitance.

Finally, the quality factor Q of capacitors with sufficient capacitance per unit area to be used in a practical manner in a capacitor bank is usually lower than desired. These capacitors are typically MOS devices with severe limitations on the quality factor Q due to series resistance through the device well.

SUMMARY OF THE INVENTION

To overcome the shortcomings of prior art integrated inductors and prior art inductor/varactor tuning circuits, a new and improved integrated inductor and a new and improved inductor/varactor tuning circuit are provided by the present invention.

It is an objective of the present invention to provide a new and improved variable integrated inductor.

It is another objective of the present invention to provide a new and improved inductor/varactor tuning circuit.

A variable integrated inductor, constructed in accordance with the present invention, includes an inductor, a single loop winding positioned in proximity to the inductor and having an open circuit, and means for selectively closing the open circuit of the single loop winding to magnetically couple the single loop winding to the inductor and decrease the magnetic field of the inductor. A switched inductor/varactor tuning circuit, constructed in accordance with the present invention, includes this variable integrated inductor connected with a varactor.

It is to be understood that the foregoing general description of the present invention and the following detailed description of the present invention are exemplary, but are not restrictive of the invention.

BRIEF DESCRIPTION OF THE DRAWING

FIG. 3A is a schematic perspective representation of a first embodiment of a variable integrated inductor constructed in accordance with the present invention that can be used in the switched inductor/varactor tuning circuit of FIG. 2.

FIG. 3B is a schematic perspective representation of a second embodiment of a variable integrated inductor constructed in accordance with the present invention that can be used in the switched inductor/varactor tuning circuit of FIG. 2.

FIG. 3C is a schematic perspective representation of a third embodiment of a variable integrated inductor constructed in accordance with the present invention that can be used in the switched inductor/varactor tuning circuit of FIG. 2.

DETAILED DESCRIPTION OF THE INVENTION

The present invention makes use of transformer coupling to reduce the net magnetic field of an inductor. This reduction in magnetic field, achieved by selective switching of inductor elements, translates to a reduced inductance, providing a means of reducing the effective inductance of an inductor without changing its geometry.

The basic operation of the present invention can be understood from a review of the reflected impedance seen on the primary or input side of a transformer. An ideal transformer with an arbitrary load on the secondary will have an input impedance given by:

$$Z_{in} = Z_{primary} + Z_{reflected} \quad (1)$$

where $$Z_{primary} = j\omega L_1$$

where $L_1$ is the inductance of the primary coil $$Z_{reflected} = \frac{\omega^2 M^2}{j\omega L_2 + Z_L}$$

where
$L_2$ is the inductance of the secondary coil
$Z_L$ is the reactance of the load on the secondary coil
$M = k*\text{sqrt}(L_1 L_2)$ and is the mutual inductance between the primary and secondary coils
where k is the magnetic coupling coefficient between the primary and secondary coils As can be seen from the foregoing, the input impedance, looking into the primary, can be rewritten as $$Z_{in} = j\omega L_1 - k^2 j\omega L_1 = j\omega L_1(1-k^2) \quad (2)$$

making the assumption that $Z_L$ is much less than $j\omega L_2$ corresponding to a short circuit load.

This can be interpreted as an effective reduction in the inductance of the primary coil of the transformer by the factor $(1-k^2)$.

Figure 2:
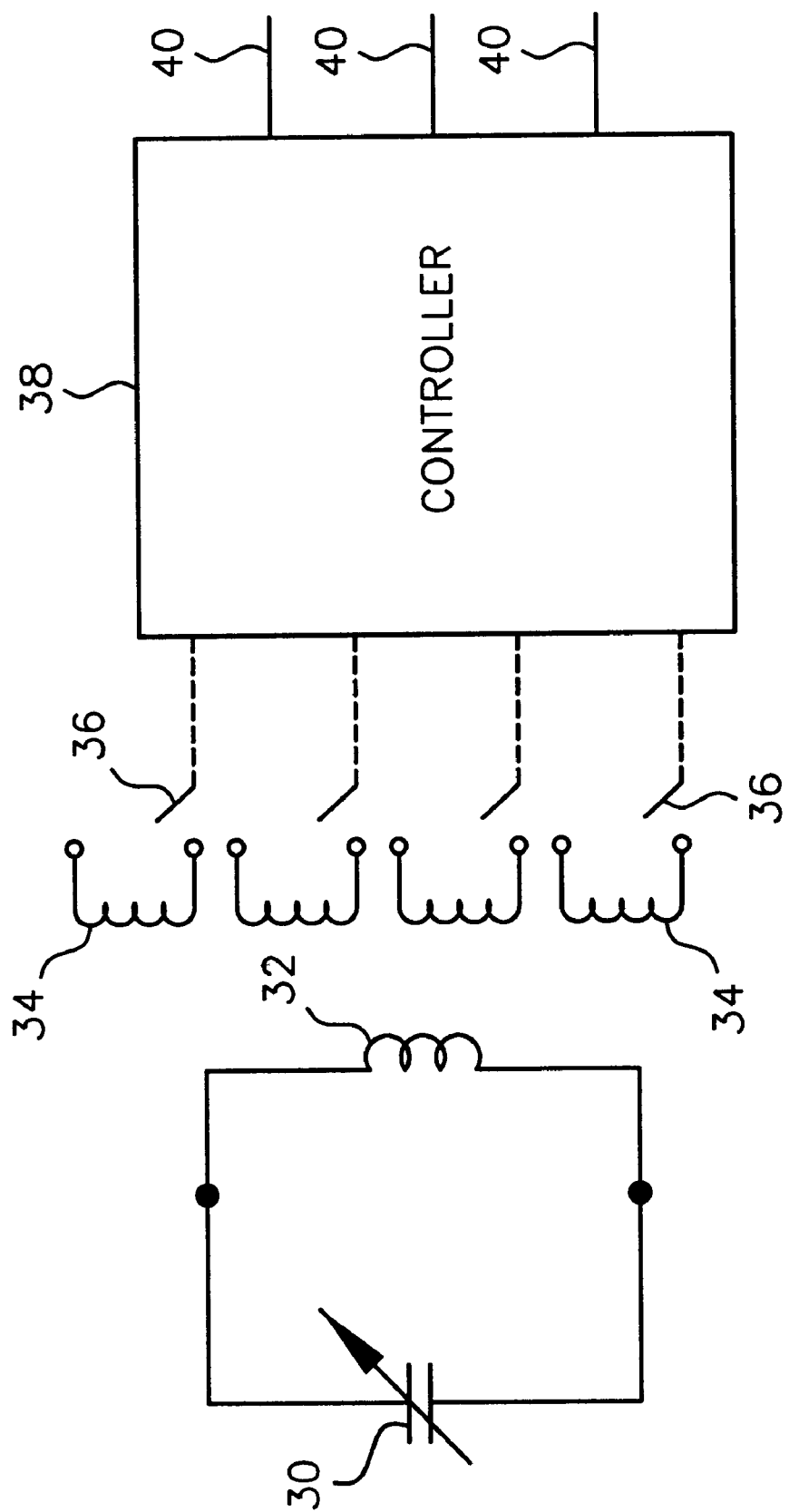
FIG. 2 is a schematic diagram of a switched inductor/varactor tuning circuit constructed in accordance with the present invention.

Referring to FIG. 2, a switched inductor/varactor tuning circuit, constructed in accordance with the present invention, includes a varactor 30 and an inductor 32 connected with the varactor. As will be explained in connection with the description below of FIGS. 3A, 3B, 3C, and 4, inductor 32 is typically a planar spiral winding.

In accordance with the present invention, a plurality of inductors 34 is positioned in proximity to inductor 32. Each inductor 34 has an open circuit that is closed by an associated switch 36. Operation of switches 36 is controlled by a controller 38 from which control signals are supplied to selectively close and open the switches and thereby change the inductance of inductor 32 and, consequently, the tuning of the circuit as the open circuits of inductors 34 are closed or opened. Controller 38 receives input signals along input lines 40 that define which open circuits of the inductors 34 are to be closed or are to remain open.

Thus, switches 36 and controller 38 function to selectively close the open circuits of inductors 34. As the open circuits of inductors 34 are closed, inductors 34 are magnetically coupled to inductor 32 and the magnetic field of inductor 32 is decreased. It will be understood that switches 36, which can be FET's, bipolar devices or micro electromechanical switches, can be included in controller 38 but are shown outside the controller to facilitate explaining the present invention.

As indicated above and as shown in FIGS. 3A, 3B, 3C, and 4, inductor 32 of the FIG. 2 circuit typically is a planar spiral winding that is connected across varactor 30.

In the FIGS. 3A, 3B, and 3C embodiments of the present invention, there is only one single loop winding 34 shown positioned in proximity to inductor 32. In the FIG. 4 embodiment of the present invention, there is a plurality of single loop windings 34 shown positioned in proximity to inductor 32.

In the FIGS. 3A and 3B embodiments of the present invention, the single loop windings 34 are disposed around the axis of planar spiral winding 32 and positioned axially of the planar spiral winding, below in FIG. 3A and above in FIG. 3B. Preferably, the single loop windings 34 have a radius equal to the radius of planar spiral winding 32 at which the magnetic field of the planar spiral winding passes through zero. This single loop winding will cause maximum magnetic field reduction when the loop switch is closed, thus causing maximum inductance change.

In the FIG. 3C embodiment of the present invention, single loop winding 34 is disposed around the axis of planar spiral winding 32 and is positioned outside the planar spiral winding in the plane of the planar spiral winding.

Figure 4:
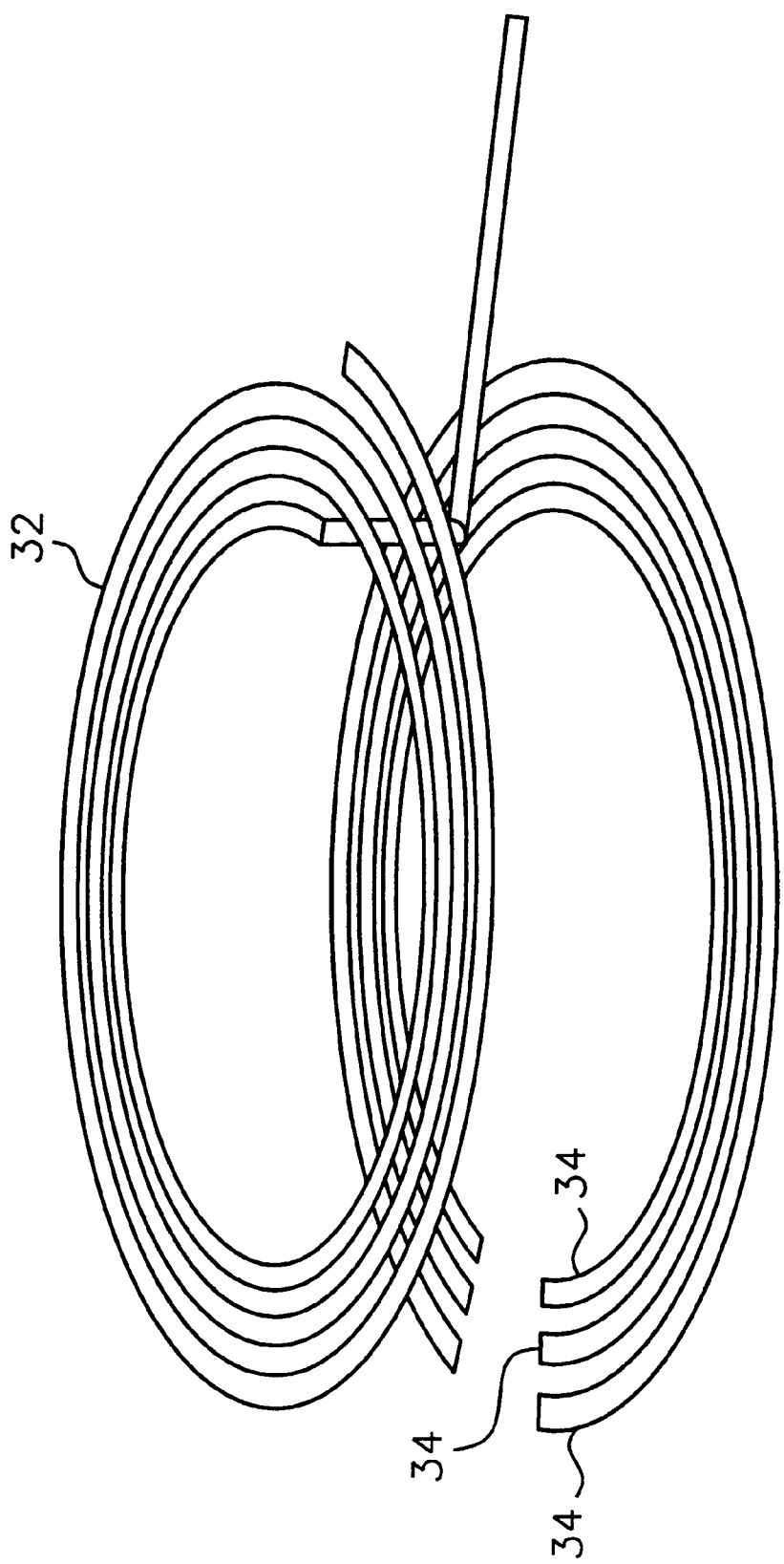
FIG. 4 is a schematic perspective representation of the FIG. 3A embodiment of a variable integrated inductor constructed in accordance with the present invention with three switchable loops rather than only one switchable loop as shown in FIG. 3A.

In the FIG. 4 embodiment of the present invention, which has a plurality of single loop windings 34, the single loop windings are disposed concentrically around the axis of planar spiral winding 32 and positioned axially of the planar spiral winding below the planar spiral winding. Preferably, one of the single loop windings 34 in the FIG. 4 embodiment has a radius equal to the radius of planar spiral winding 32 at which the magnetic field of the planar spiral winding passes through zero for the reason expressed above in connection with the radii of the single loop windings 34 of FIGS. 3A and 3B.

Figure 1:
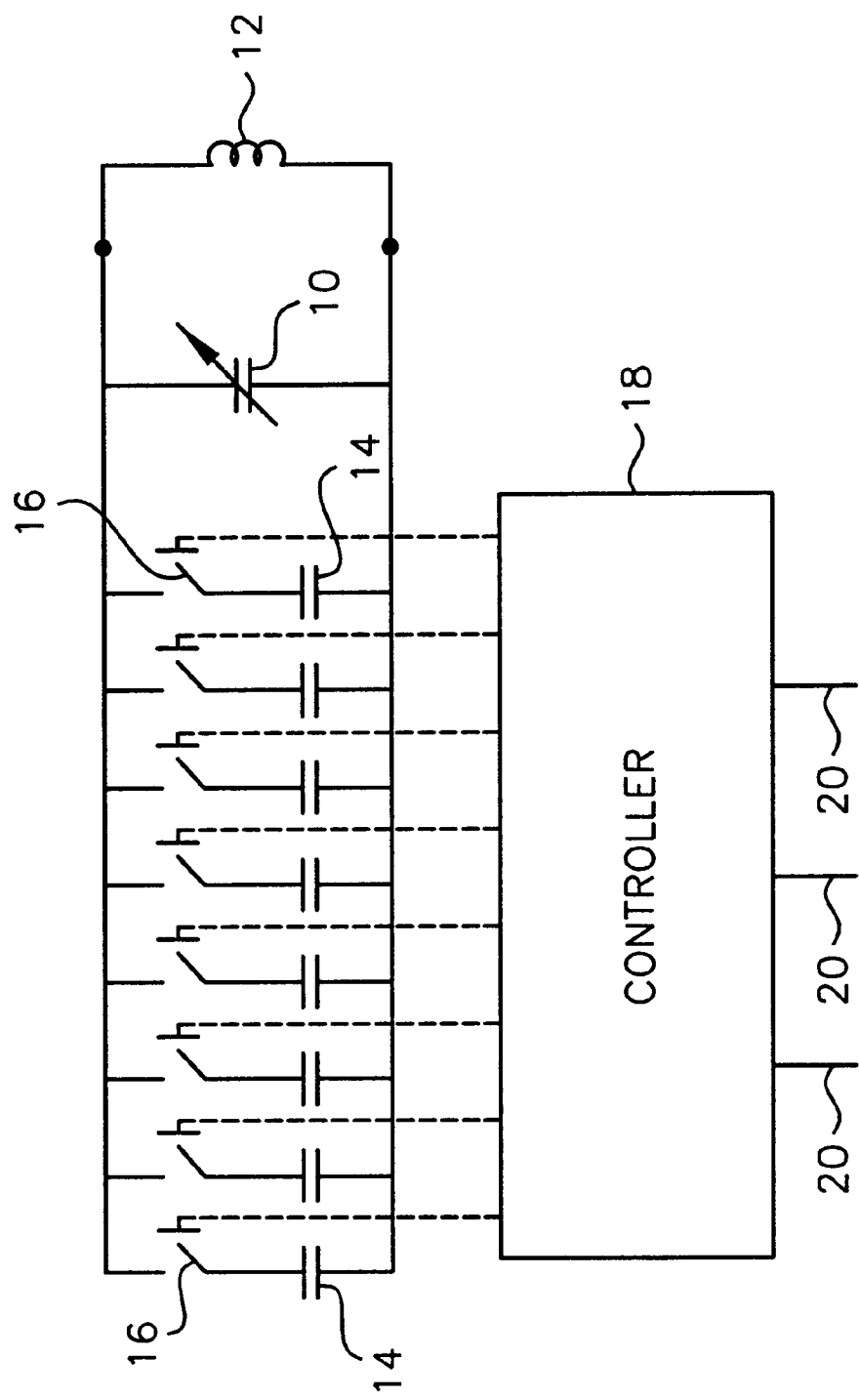
FIG. 1 is a schematic diagram of a prior art switched capacitor/varactor tuning circuit.

A discretely variable reactive element having an integrated inductor, in accordance with the present invention, rather than a bank of capacitors achieves a discrete variation in inductance at least as high as 3:1 without adding fixed capacitance. This preserves the maximum "smooth" variation in capacitance provided by the varactor, without adding any more space than is required by the varactor and the inductor. No additional space is required for a discrete capacitor bank, such as the capacitor bank shown in FIG. 1. The inherent limitations in the quality factor Q of the discrete capacitors used in the capacitor bank are eliminated.

Although illustrated and described above with reference to certain specific embodiments, the present invention nevertheless is not intended to be limited to the details shown. Rather, various modifications may be made in the details within the scope and range of equivalents of the claims and without departing from the spirit of the invention.

What is claimed:

1. A variable integrated inductor comprising:
   an inductor;
   a single loop winding positioned in proximity to said inductor and having an open circuit; and
   means for selectively closing the open circuit of said single loop winding to magnetically couple said single loop winding to said inductor and decrease the magnetic field of said inductor.

2. A variable integrated inductor according to claim 1 wherein said inductor is a planar spiral winding.

3. A variable integrated inductor comprising:
   an inductor;
   a plurality of single loop windings positioned in proximity to said inductor and each having an open circuit; and
   means for selectively closing the open circuits of said single loop windings to selectively magnetically couple said single loop windings to said inductor and decrease the magnetic field of said inductor.

4. A variable integrated inductor according to claim 3 wherein:
   (a) said inductor is a planar spiral winding, and
   (b) said single loop windings are disposed concentrically around the axis of said planar spiral winding and positioned axially of said planar spiral winding.

5. A variable integrated inductor according to claim 4 wherein one of said single loop windings has a radius equal to the radius of said planar spiral winding at which the magnetic field of said planar spiral winding passes through zero.

6. A variable integrated inductor according to claim 3 wherein:
   (a) said inductor is a planar spiral winding, and
   (b) said single loop windings are disposed concentrically around the axis of said planar spiral winding and positioned outside said planar spiral winding in the plane of said planar spiral winding.

7. A switched inductor/varactor tuning circuit comprising:
   a varactor;
   an inductor;
   a single loop winding positioned in proximity to said inductor and having an open circuit; and
   means for selectively closing the open circuit of said single loop winding to magnetically couple said single loop winding to said inductor and decrease the magnetic field of said inductor.

8. A switched inductor/varactor tuning circuit according to claim 7 wherein said inductor is a planar spiral winding.

9. A switched inductor/varactor tuning circuit comprising:
   a varactor;
   an inductor;
   a plurality of single loop windings positioned in proximity to said inductor and each having an open circuit; and
   means for selectively closing the open circuits of said single loop windings to selectively magnetically couple said single loop windings to said inductor and decrease the magnetic field of said inductor.

10. A switched inductor/varactor tuning circuit according to claim 9 wherein:
    (a) said inductor is a planar spiral winding, and
    (b) said single loop windings are disposed concentrically around the axis of said planar spiral winding and positioned axially of said planar spiral winding.

11. A variable integrated inductor according to claim 10 wherein one of said single loop windings has a radius equal to the radius of said planar spiral winding at which the magnetic field of said planar spiral winding passes through zero.

12. A switched inductor/varactor tuning circuit according to claim 9 wherein:
    (a) said inductor is a planar spiral winding, and
    (b) said single loop windings are disposed concentrically around the axis of said planar spiral winding and positioned outside said planar spiral winding in the plane of said planar spiral winding.

* * * * *